United States Patent
Xu et al.

(10) Patent No.: US 10,651,173 B1
(45) Date of Patent: May 12, 2020

(54) SINGLE DIFFUSION CUT FOR GATE STRUCTURES

(71) Applicant: GLOBALFOUNDRIES INC., Grand Cayman (KY)

(72) Inventors: Guowei Xu, Ballston Lake, NY (US); Hui Zang, Guilderland, NY (US); Ruilong Xie, Niskayuna, NY (US); Haiting Wang, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/204,506

(22) Filed: Nov. 29, 2018

(51) Int. Cl.
| | |
|---|---|
| *H01L 27/088* | (2006.01) |
| *H01L 29/06* | (2006.01) |
| *H01L 21/8234* | (2006.01) |
| *H01L 29/66* | (2006.01) |

(52) U.S. Cl.
CPC .. *H01L 27/0886* (2013.01); *H01L 21/823431* (2013.01); *H01L 21/823468* (2013.01); *H01L 21/823481* (2013.01); *H01L 29/0649* (2013.01); *H01L 29/66545* (2013.01)

(58) Field of Classification Search
CPC ............. H01L 27/0886; H01L 29/0649; H01L 21/823481; H01L 21/823468; H01L 29/66545; H01L 21/823431
USPC ......................................................... 257/401
See application file for complete search history.

(56) References Cited

U.S. PATENT DOCUMENTS

| | | | |
|---|---|---|---|
| 8,846,491 B1 | 9/2014 | Pham et al. | |
| 8,916,460 B1 | 12/2014 | Kwon et al. | |
| 8,956,912 B2 * | 2/2015 | Yamazaki | H01L 29/66742 257/E21.476 |
| 9,171,752 B1 | 10/2015 | Wu et al. | |
| 9,412,616 B1 | 8/2016 | Xie et al. | |
| 9,978,746 B2 * | 5/2018 | Yeo | H01L 27/088 |
| 2014/0117454 A1 | 5/2014 | Liu et al. | |

* cited by examiner

*Primary Examiner* — Vu A Vu
(74) *Attorney, Agent, or Firm* — Francois Pagette; Andrew M. Calderon; Roberts Calderon Safran & Cole, P.C.

(57) ABSTRACT

The present disclosure relates to semiconductor structures and, more particularly, to a single diffusion cut for gate structures and methods of manufacture. The structure includes: a plurality of fin structures composed of semiconductor material; a plurality of replacement gate structures extending over the plurality of fin structures; a plurality of diffusion regions adjacent to the each of the plurality of replacement gate structures; and a single diffusion break between the diffusion regions of the adjacent replacement gate structures, the single diffusion break being filled with an insulator material. In a first cross-sectional view, the single diffusion break extends into the semiconductor material and in a second cross-sectional view, the single diffusion break is devoid of semiconductor material of the plurality of fin structures.

19 Claims, 7 Drawing Sheets

SINGLE DIFFUSION CUT FOR GATE STRUCTURES

FIELD OF THE INVENTION

The present disclosure relates to semiconductor structures and, more particularly, to a single diffusion cut for gate structures and methods of manufacture.

BACKGROUND

As semiconductor processes continue to scale downwards, e.g., shrink, the desired spacing between features (i.e., the pitch) also becomes smaller. To this end, in the smaller technology nodes it becomes ever more difficult to fabricate features due to the critical dimension (CD) scaling and process capabilities.

For example, in the fabrication of FinFET structures, single diffusion breaks become very attractive in standard cell scaling. The processes for fabricating the single diffusion breaks, though, are very challenging in advanced technologies. By way of illustration, conventionally, multiple Rx regions in a semiconductor integrated circuit include arrays of parallel extending fins having distal ends abutting the edges of each Rx region. The fin arrays are terminated by dummy gates, which extend laterally across the distal ends of the fins at the edges of the Rx regions. The dummy gates are used to induce symmetrical epitaxial growth of source/drain regions (S/D regions) on the end portions of the fins located between the dummy gates and adjacent active gates.

To fabricate the single diffusion break, a deep trench undercut adjacent to the source and drain epitaxial regions is provided by removing the dummy gate structure (poly material). The deep trench etch undercut damages or removes portions of the epitaxial source and drain regions. This results in smaller source/drain epitaxial volume and electrical contact area compared to that of the source and drain regions located between active gates. The smaller source and drain region volume and contact area can lead to greater contact resistance and degrade device performance.

SUMMARY

In an aspect of the disclosure, a structure comprises: a plurality of fin structures composed of semiconductor material; a plurality of replacement gate structures extending over the plurality of fin structures; a plurality of diffusion regions adjacent to the each of the plurality of replacement gate structures; and a single diffusion break between the diffusion regions of the adjacent replacement gate structures, the single diffusion break being filled with an insulator material. In a first cross-sectional view, the single diffusion break extends into the semiconductor material and in a second cross-sectional view, the single diffusion break is devoid of semiconductor material of the plurality of fin structures.

In an aspect of the disclosure, a structure comprises: a substrate material; a plurality of metal gate structures on the substrate material and comprising sidewall spacers, metal material and diffusion regions; and a single diffusion break structure between adjacent metal gate structures of the plurality of metal gate structures, the single diffusion break structure extending into the substrate in a first cross-section and being devoid of the substrate material in a second cross-section. The first cross-section is perpendicular to the plurality of metal gate structures and the second cross-section is parallel to a longitudinal axis of the plurality of metal gate structures.

In an aspect of the disclosure, the method comprises: forming a plurality of fin structures from semiconductor material; forming dummy gate structures over the plurality of fin structures; forming diffusion regions adjacent to the dummy gate structures; removing a portion of at least one of the plurality of dummy gate structures; forming single diffusion break structure comprising: forming a trench in the semiconductor material aligned with the removed portion of the at least one of the plurality of dummy gate structures and adjacent to the diffusion regions, while also removing selected fin structures; and filling the trench with insulator material; and replacing the dummy gate structures with replacement gate structures.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to a single diffusion cut for gate structures and methods of manufacture. More specifically, the present disclosure provides a single diffusion cut process for advanced FinFET technologies. Advantageously, the single diffusion cut process eliminates damage and/or defects to epitaxial source/drain regions during replacement metal gate processes, e.g., during deep trench etch processes to remove the dummy gate material. Accordingly, by implementing the processes described herein, device performance can be maintained even at smaller technology nodes, e.g., 10 nm technology node and smaller.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structures of the present disclosure have been adopted from integrated circuit (IC) technology. For example, the structures are built on wafers and are realized in films of material patterned by photolithographic processes on the top of a wafer. In particular, the fabrication of the structures use three basic building blocks: (i) deposition of thin films of material on a substrate, (ii) applying a patterned mask on top of the films by photolithographic imaging, and (iii) etching the films selectively to the mask.

Figure 1A:
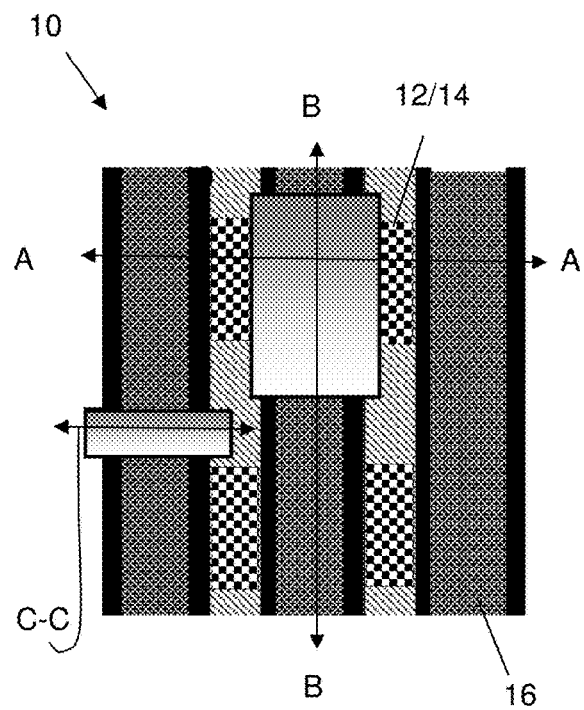
FIG. 1A shows a top view of an incoming structure and respective fabrication processes in accordance with aspects of the present disclosure.
Figure 1C:
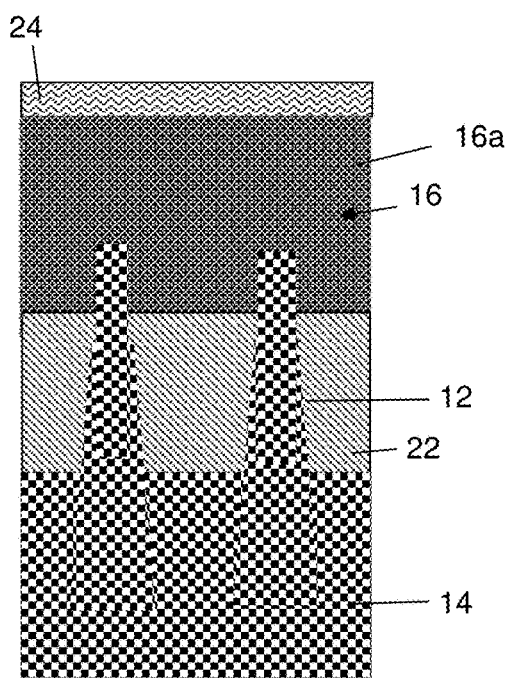
FIG. 1C shows a cross-sectional view along line B-B of FIG. 1A.
Figure 1B:
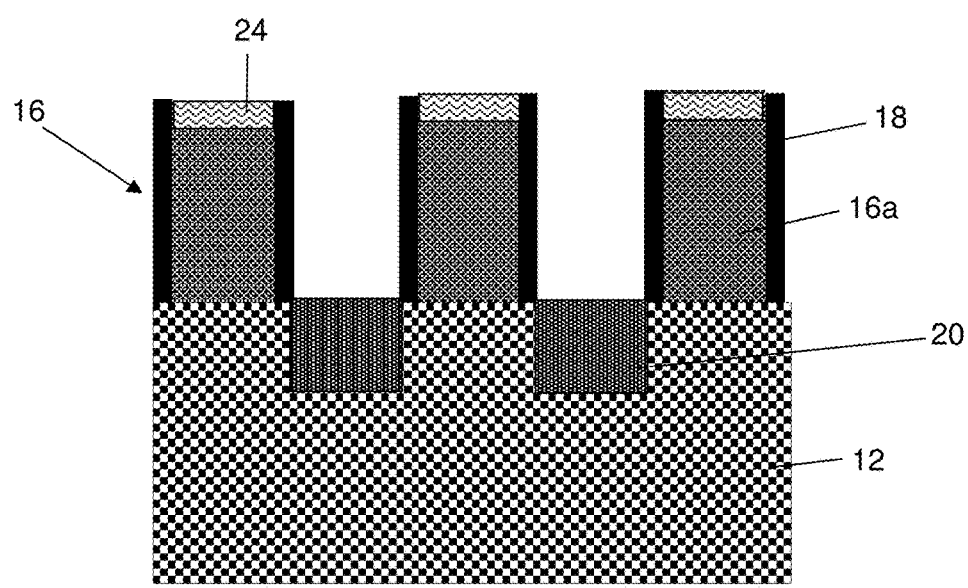
FIG. 1B shows a cross-sectional view along line A-A of FIG. 1A.

FIG. 1A shows a top view of an incoming structure and respective fabrication processes in accordance with aspects of the present disclosure. FIG. 1B shows a cross-sectional view along line A-A of FIG. 1A and FIG. 1C shows a cross-sectional view along line B-B of FIG. 1A. Referring to FIGS. 1A-1C, the structure 10 includes a plurality of tapered fin structures 12 composed of any suitable substrate material 14. In embodiments, the substrate material 14 can be composed of any suitable material including, but not limited to, Si, SiGe, SiGeC, SiC, GaAs, InAs, InP, and other III/V or II/VI compound semiconductors.

The fin structures 12 can be fabricated using conventional patterning processes including, e.g., sidewall imaging transfer (SIT) techniques. In an example of a SIT technique, a mandrel material, e.g., $SiO_2$, is deposited on the substrate material 14 using conventional chemical vapor deposition (CVD) processes. A resist is formed on the mandrel material, and exposed to light to form a pattern (openings). A reactive ion etching (RIE) is performed through the openings to form the mandrels. In embodiments, the mandrels can have different widths and/or spacing depending on the desired dimensions between the fin structures 12. Spacers are formed on the sidewalls of the mandrels which are preferably material that is different than the mandrels, and which are formed using conventional deposition processes known to those of skill in the art. The mandrels are removed or stripped using a conventional etching process, selective to the mandrel material. An etching is then performed within the spacing of the spacers to form the sub-lithographic features. Due to the etching process, the fin structures 12 can have a tapered profile as shown in FIG. 1C, for example. The sidewall spacers can then be stripped.

Dummy gate structures 16 extend orthogonally over the fin structures 12. In embodiments, the dummy gate structures 16 are composed of polysilicon material 16a and capping material 24, e.g., SiN, both of which are deposited over the fin structures 12 and patterned using conventional lithography and etching processes such that no further explanation is required herein for an understanding of the formation of the dummy gate structures 16. A sidewall spacer material 18 is deposited and patterned over the dummy gate structures 16. In embodiments, the sidewall spacer material 18 is a low-k dielectric material deposited by a conventional CVD process, followed by an anisotropic etching process to expose the upper surface of the polysilicon material of the dummy gate structures 16.

As shown in FIGS. 1A and 1C, isolation regions (shallow trench isolation regions) 22 can be formed adjacent the dummy gate structures 16 and between the fin structures 14. The isolation regions 22 can be, e.g., oxide, deposited by conventional CVD processes, followed by a planarization process such as a chemical mechanical polishing (CMP). In addition, as shown in FIG. 1B, diffusion regions 20, e.g., source and drain regions, are formed adjacent to the dummy gate structures 16. In embodiments, the source and drain regions 20 can be fabricated by conventional processes including doped epitaxial processes to form raised source and drain regions. In alternative embodiments, the source and drain regions 20 can be planar and subjected to ion implantation or doping processes to form diffusion regions as is known in the art.

Figure 2A:
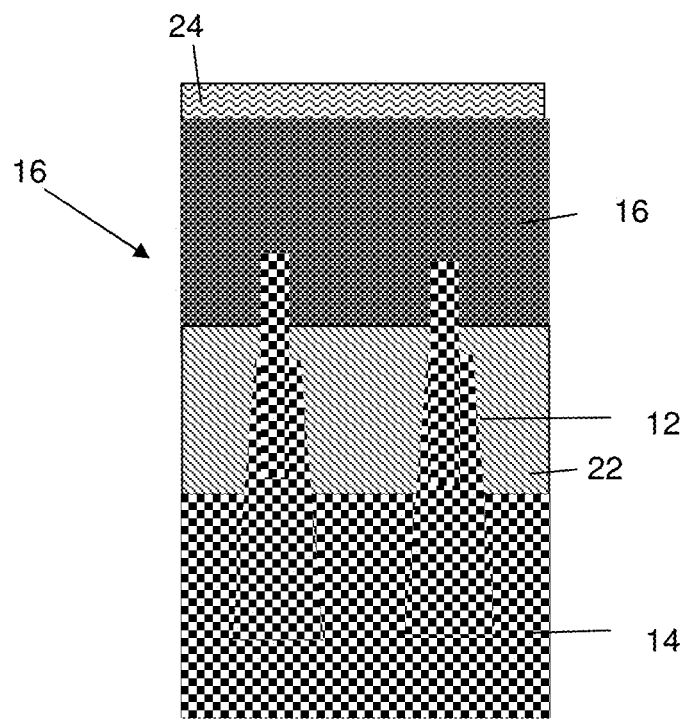
FIGS. 2A and 2B are cross-sectional views showing fill material between dummy gate structures, amongst other features, and respective fabrication processes in accordance with aspects of the present disclosure.
Figure 2B:
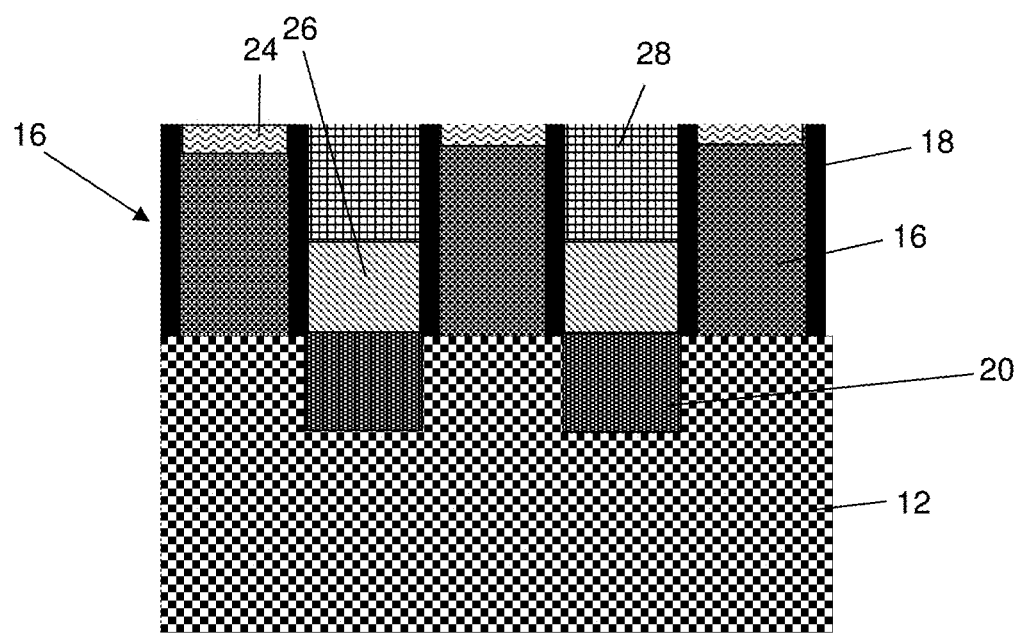

FIGS. 2A and 2B are cross-sectional views showing fill material between the dummy gate structures, amongst other features, and respective fabrication processes. More specifically, a spin on material 26, e.g., oxide material, is formed between the dummy gate structures 16 and, more particularly, between the sidewall spacers 18. In embodiments, the material 26 is deposited by a spin on technique known to those of skill in the art. Following the deposition process, the material 26 is recessed by a timed etch back process. A high-density insulator material 28 is deposited over the material 26. In embodiments, the high-density insulator material 28 can be $Al_2O_3$, which will protect the material 26 during subsequent fabrication processes. The high-density insulator material 28 is subjected to a chemical mechanical polishing (CMP). In this way, the high-density insulator material 28 is planar with the capping material 24.

Figure 3A:
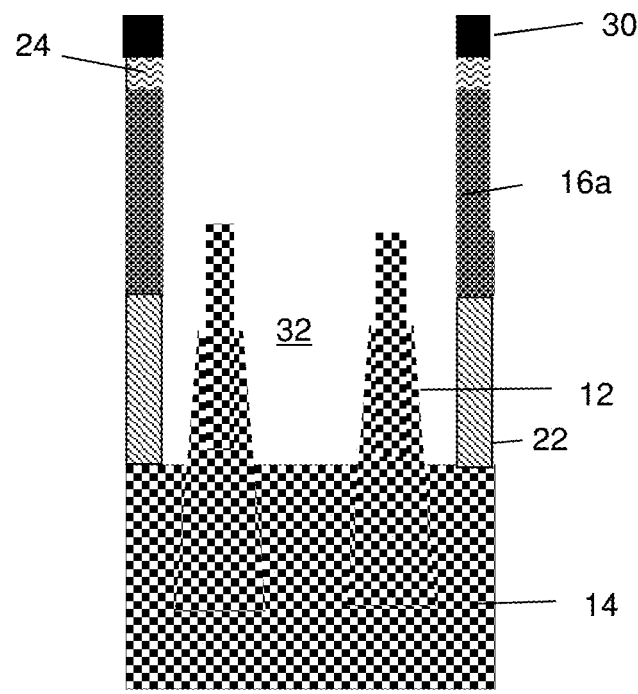
FIGS. 3A and 3B are cross-sectional views showing trenches, i.e., upper portion of a single diffusion break cut, amongst other features, and respective fabrication processes in accordance with aspects of the present disclosure.
Figure 3B:
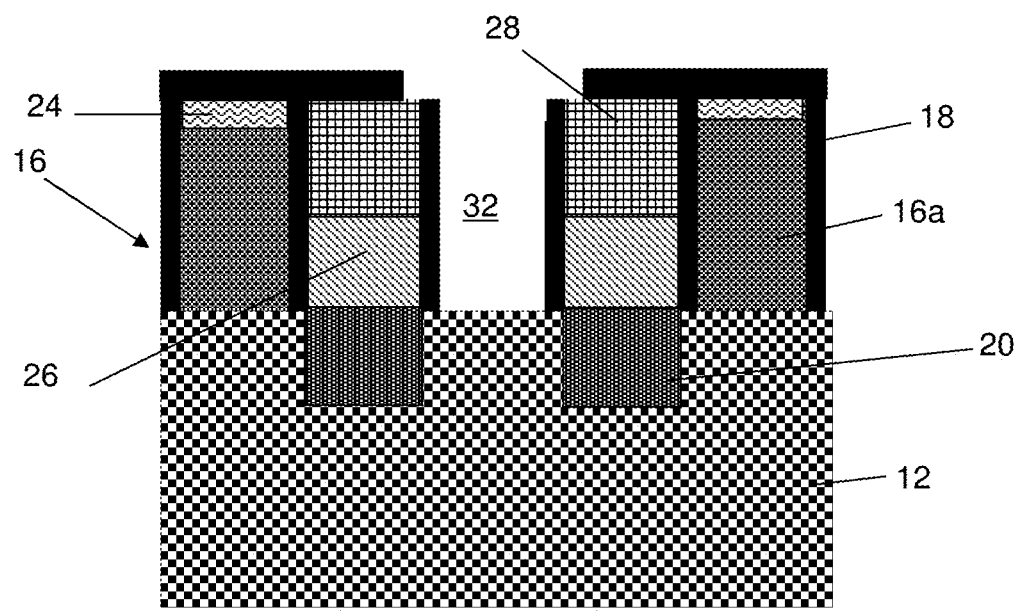

FIGS. 3A and 3B are cross-sectional views showing an upper portion of a single diffusion break cut, amongst other features, and respective fabrication processes. More specifically, as shown in FIGS. 3A and 3B, photoresist material 30 deposited over the capping material 24 is exposed to energy (light) to form a pattern (opening). An etching process with a selective chemistry, e.g., RIE, will be used to form one or more trenches 32 (e.g., with a top portion being a portion of a single diffusion break cut) by removing materials 24, 16 and 22 through the openings of the photoresist material 30. For example, the etching process is a nitride etch, followed by a poly dummy gate material etch, stopping on the fin structures 12. An oxide etch is then performed to remove the oxide material 22 between fin structures 12 in order to completely expose the fin structures 12 as shown in both FIGS. 3A and 3B. The photoresist material 30 is removed by a conventional oxygen ashing process or other known stripants. During this etching process, the high-density insulator material 28 will protect the underlying oxide material 26.

Figure 4A:
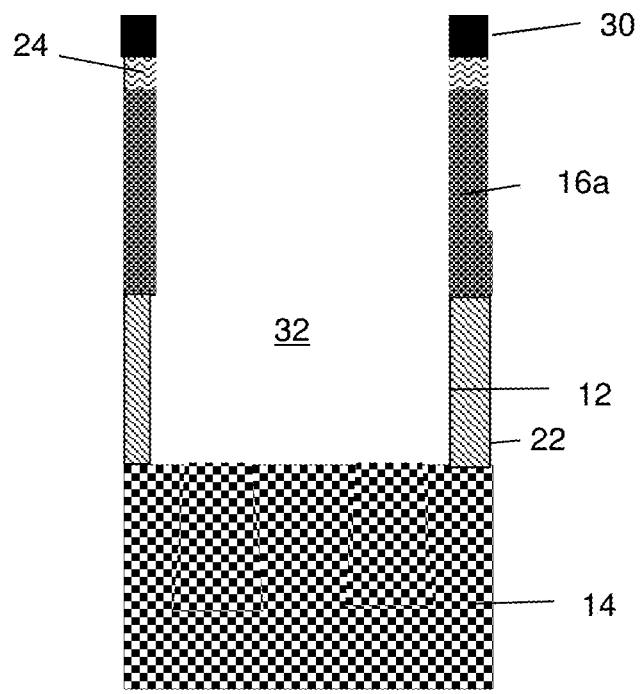
FIGS. 4A and 4B are cross-sectional views showing a single diffusion break cut, amongst other features, and respective fabrication processes in accordance with aspects of the present disclosure.
Figure 4B:
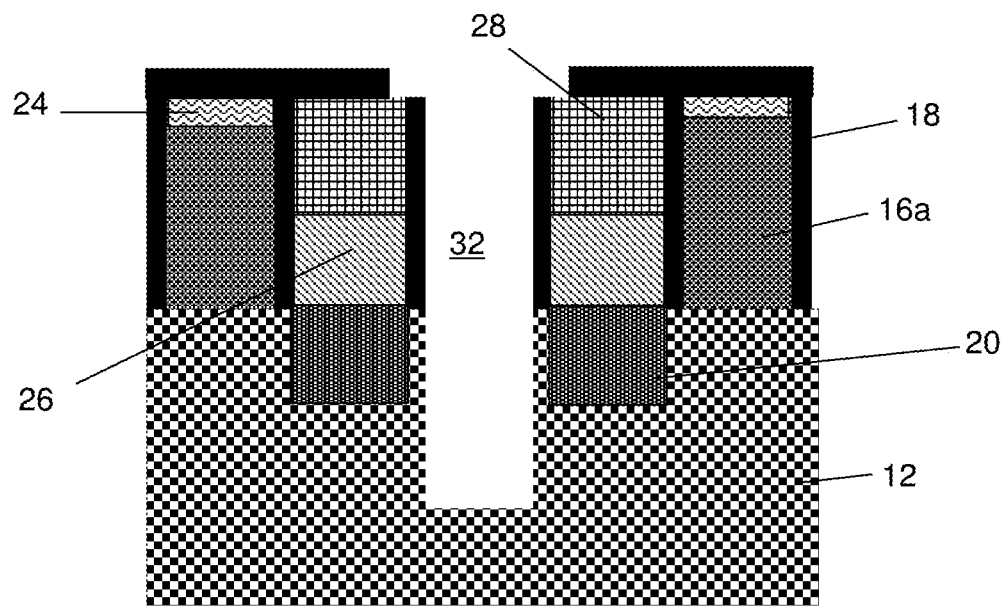

FIGS. 4A and 4B are cross-sectional views showing the single diffusion break cut, amongst other features, and respective fabrication processes. In particular, in FIG. 4A the exposed fin structures shown in FIG. 3A are completely removed by a selective etching process. In this way, there is can be no residual semiconductor material in this trench (i.e., in an orientation that is parallel to a longitudinal axis of the plurality of replacement gate structures as shown in FIGS. 7A-7C), thereby preventing any shorts from occurring during device operation (which can otherwise result from the tapered profile of the fin structures).

Figure 7A:
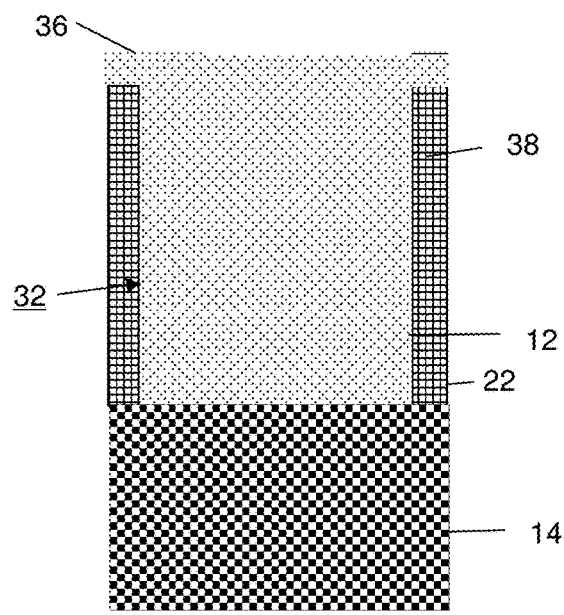
FIGS. 7A-7C show replacement gate structures, amongst other features, and respective fabrication processes in accordance with aspects of the present disclosure.
Figure 7C:
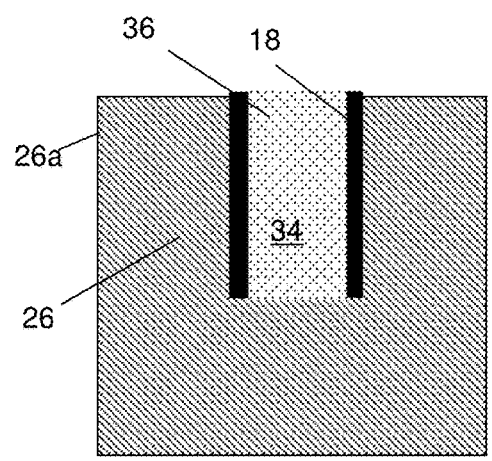
Figure 7B:
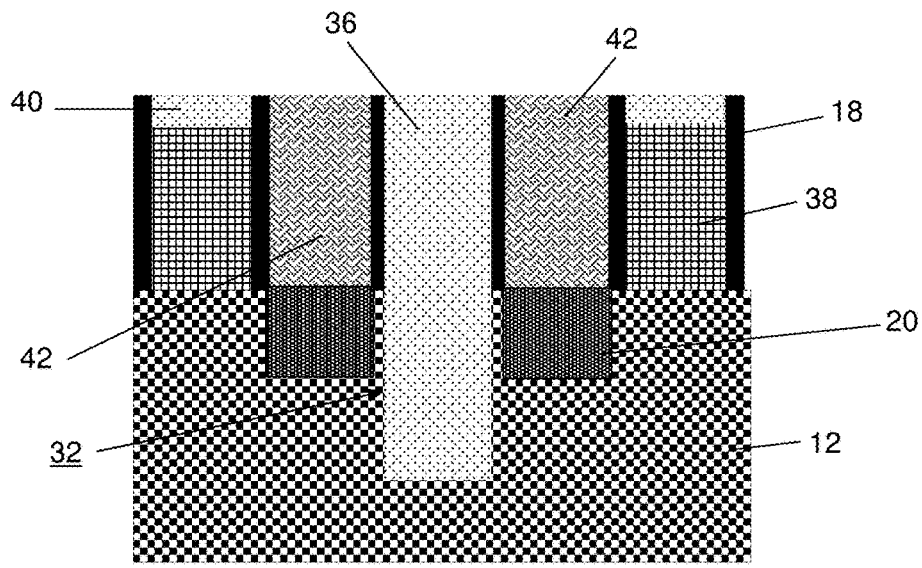

FIG. 4B shows the trench 32 extending into the underlying substrate 14 (e.g., fin structures 12) between the diffusion regions 20 (i.e., in an orientation that is perpendicular to the plurality of replacement gate structures shown in FIGS. 7A-7C). In embodiments, the trench 32 will be the single diffusion break cut. Again, during this etching process, the high-density insulator material 28 will protect the underlying oxide material 26.

Figure 5A:
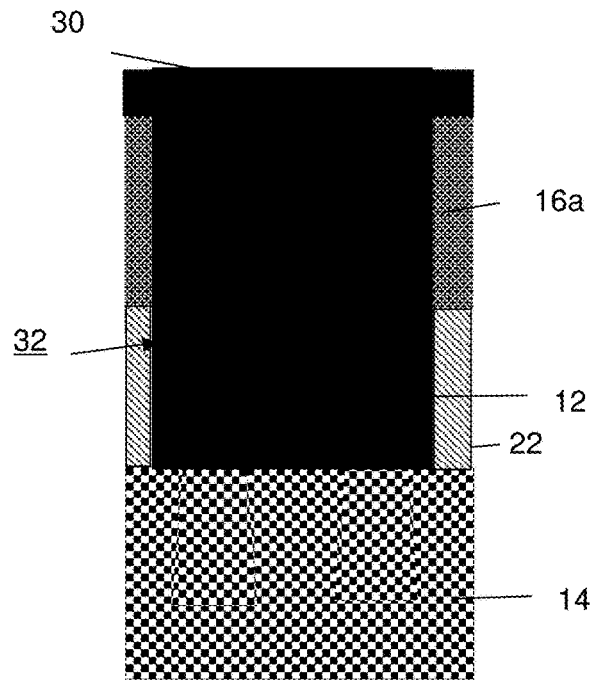
FIGS. 5A-5C are cross-sectional views showing a cut between dummy gate structures, amongst other features, and respective fabrication processes in accordance with aspects of the present disclosure.
Figure 5C:
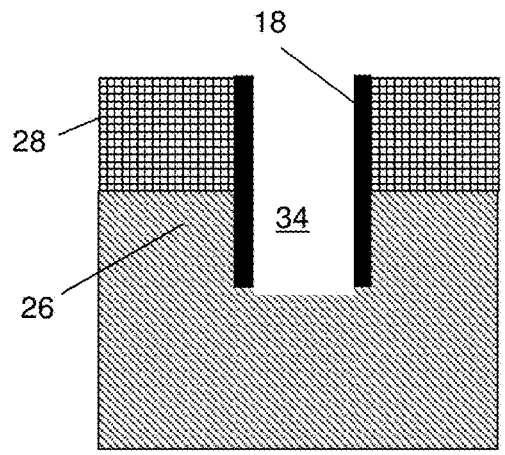
Figure 5B:
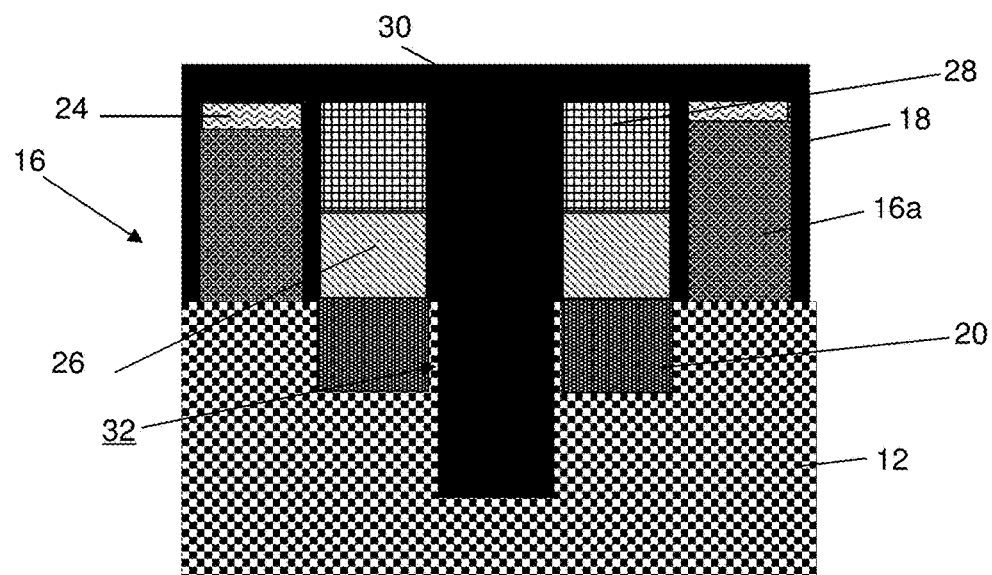

FIGS. 5A-5C are cross-sectional views showing a trench used as a gate cut, amongst other features, and respective fabrication processes. More specifically, FIG. 5C is a cross-sectional view along line C-C of FIG. 1A (later in the fabrication process) which shows the formation of a gate cut or trench 34. In this fabrication process, the trenches 32 are filled with a photoresist material 30, as shown in FIGS. 5A and 5B; whereas, in FIG. 5C, an opening is formed in the photoresist material 30 by exposure to energy (light). Following the formation of the opening, the trench 34 between the sidewall spacers 18 is formed by removal of the dummy gate material between the sidewall spacers 18.

Figure 6A:
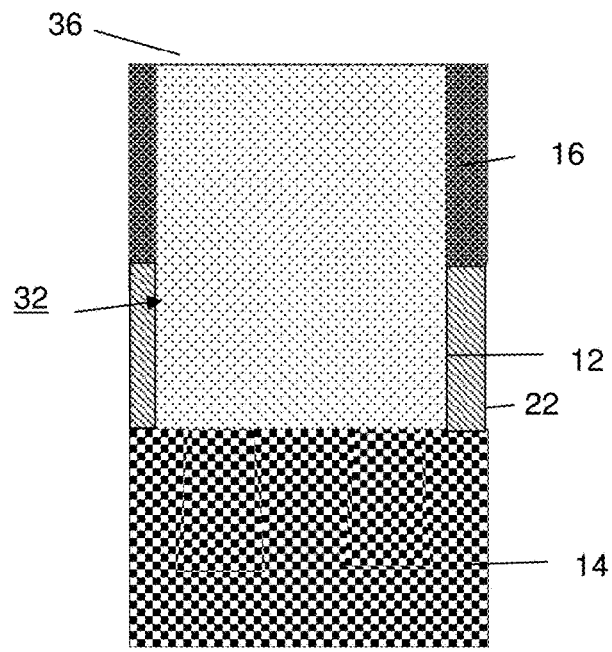
FIGS. 6A-6C shows the trenches including the single diffusion break cut filled with insulator material, amongst other features, and respective fabrication processes in accordance with aspects of the present disclosure.
Figure 6C:
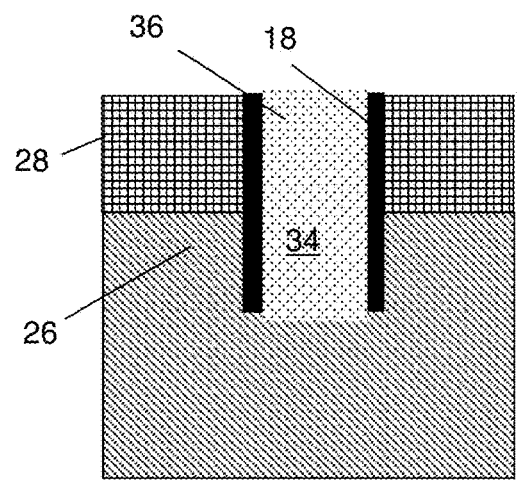
Figure 6B:
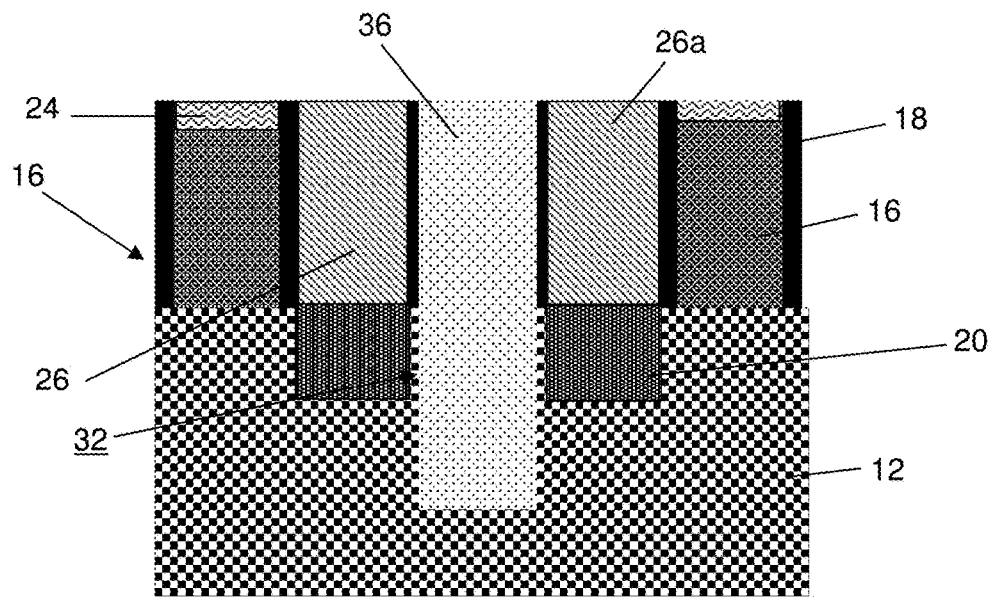

In FIGS. 6A-6C, the photoresist material 30 is removed by an oxygen ashing process or use of other stripant process. A nitride material 36 is then deposited within the trenches 32, 34. In embodiments, the nitride material 36 can be deposited by a CVD process, followed by a CMP process. The nitride material 36 is an insulator material which will form the single diffusion cut within the trench 32; whereas, the nitride material 36 in the trench 34 will act as a gate cut along a longitudinal axis of subsequently formed replacement gate structures shown in FIGS. 7A-7C.

FIGS. 7A-7C show replacement gate structures, amongst other features, and respective fabrication processes. As shown in FIG. 7B, the polysilicon and capping material of the dummy gate structures are removed by a selective etch chemistry process and replaced with replacement gate materials 38, 40. The material 38 can be composed of a high-k dielectric material and a metal material, e.g., tungsten or other workfunction metal, and the material 40 can be a capping material such as nitride. In embodiments, the materials 38, 40 can be deposited by a conventional deposition process, followed by a CMP process.

Referring still to FIG. 7B, the oxide material is removed by a conventional selective etch chemistry process and replaced with a contact material 42 in contact with the source and drain regions 20. In embodiments, the contact material 42 can be aluminum or copper, as examples. As should be understood by those of skill in the art, the source and drain regions 20 can undergo a silicide process prior to contact formation. The silicide begins with deposition of a thin transition metal layer, e.g., nickel, cobalt or titanium, over fully formed and patterned semiconductor devices (e.g., doped or ion implanted source and drain regions 20). After deposition of the material, the structure is heated allowing the transition metal to react with exposed silicon (or other semiconductor material as described herein) in the active regions of the semiconductor device (e.g., source, drain, gate contact region) forming a low-resistance transition metal silicide. Following the reaction, any remaining transition metal is removed by chemical etching, leaving silicide contacts in the active regions of the device. It should be understood by those of skill in the art that silicide contacts will not be required on the devices, when a gate structure is composed of a metal material.

As shown in FIG. 7C, prior to forming the replacement gate structures, the high-density insulator material 28 is removed and replaced with oxide material 26a. In embodiments, the oxide material 26a is deposited by a conventional CVD process followed by a CMP process. This oxide material 26a will act as an isolation region for the replacement gate structures, while the nitride material in the trench 34 will act as a gate cut along a longitudinal axis of adjacent replacement gate structures. As seen in FIG. 7C, the sidewalls of the trench 34 are lined with the sidewall spacer material 18.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   a plurality of fin structures composed of semiconductor material;
   a plurality of replacement gate structures extending over the plurality of fin structures;
   a plurality of diffusion regions adjacent to the each of the plurality of replacement gate structures; and
   a single diffusion break between the diffusion regions of the adjacent replacement gate structures, the single diffusion break being filled with an insulator material, wherein
   in a first cross-sectional view, the single diffusion break extends into the semiconductor material,
   in a second cross-sectional view, the single diffusion break is devoid of semiconductor material of the plurality of fin structures, and
   a replacement gate cut along a longitudinal axis of the adjacent replacement gate structures which includes the insulator material of the single diffusion break and which isolates the adjacent replacement gate structures along their longitudinal axis from one another.

2. The structure of claim 1, wherein the insulator material is nitride material.

3. The structure of claim 2, wherein the single diffusion break is a cut in the semiconductor material and cross-section of fin structures that separates the diffusion regions of the adjacent plurality of replacement gate structures.

4. The structure of claim 1, wherein the replacement gate cut is filled with a same material as the single diffusion break.

5. The structure of claim 4, wherein the same material is nitride material.

6. The structure of claim 1, wherein the replacement gate cut is lined with a sidewall spacer.

7. The structure of claim 1, wherein the first cross-sectional view is perpendicular to the plurality of replacement gate structures and the second cross-sectional view is parallel to a longitudinal axis of the plurality of replacement gate structures.

8. The structure of claim 1, wherein:
the insulator material of the single diffusion break abuts and directly contacts a liner material along its sidewalls extending from directly above the semiconductor material;
the insulator material of the replacement gate cut abuts and directly contacts the liner material; and
the replacement gate structures abut and directly contact the liner material; and
further comprising:
an insulator layer which is positioned and structured as an isolation region for the replacement gate structures, the insulator layer being in direct contact with the liner material and the liner material being located between the insulator material and the insulator layer; and
contact material in direct contact with the diffusion regions and abutting and directly contacting the liner material.

9. A structure comprising:
a substrate material;
a plurality of metal gate structures on the substrate material and comprising sidewall spacers, metal material and diffusion regions;
a single diffusion break structure between adjacent metal gate structures of the plurality of metal gate structures, the single diffusion break structure being filled with insulator material and extending into the substrate in a first cross-section and being devoid of the substrate material in a second cross-section, and
a gate cut along a longitudinal axis of the plurality of metal gate structures which includes the insulator material that isolates the adjacent metal gate structures along their longitudinal axis from one another,
wherein the first cross-section is perpendicular to the plurality of metal gate structures and the second cross-section is parallel to a longitudinal axis of the plurality of metal gate structures.

10. The structure of claim 9, wherein the gate cut and the single diffusion break are composed of nitride material.

11. The structure of claim 9, wherein:
the insulator material of the single diffusion break structure abuts and directly contacts a liner material along its sidewalls extending from directly above the substrate material;
the insulator material of the gate cut abuts and directly contacts the liner material; and
the metal gate structures abut and directly contact the liner material; and
further comprising:
an insulator layer which is positioned and structured as an isolation region for the gate structures, the insulator layer being in direct contact with the liner material and the liner material being located between the insulator material and the insulator layer; and
contact material in direct contact with the diffusion regions and abutting and directly contacting the liner material.

12. A method comprising:
forming a plurality of fin structures from semiconductor material;
forming dummy gate structures over the plurality of fin structures;
forming diffusion regions adjacent to the dummy gate structures;
removing a portion of at least one of the plurality of dummy gate structures and fin structures while an insulator layer over remains protected by a capping material and a spacer material;
forming of a gate cut in the insulator layer along a longitudinal axis of the dummy gate structures;
forming single diffusion break structure comprising:
forming a trench in the semiconductor material aligned with the removed portion of the at least one of the plurality of dummy gate structures and adjacent to the diffusion regions, while also removing selected fin structures; and
filling the trench with insulator material; and
filling the gate cut with the insulator material while filling the trench of the single diffusion break structure with the insulator material; and
replacing the dummy gate structures with replacement gate structures.

13. The method of claim 12, further comprising forming the spacer material about the dummy gate structures which remain after the replacement with the replacement gate structures.

14. The method of claim 13, wherein the insulator layer is an oxide material and the capping material is a blocking material over the oxide material on the diffusion regions, formed prior to the forming of the trench.

15. The method of claim 14, wherein the blocking material is $Al_2O_3$.

16. The method of claim 15, further comprising replacing the oxide material and the blocking material over the diffusion regions with contact material, after filling the trench with insulator material.

17. The method of claim 16, wherein the gate cut in the dummy gate structures remains after replacement with the replacement gate structures.

18. The method of claim 17, wherein the replacement gate structures are metal gate structures.

19. The method of claim 17, wherein the gate cut is filled with the insulator material.

* * * * *